US008775999B2

(12) United States Patent
Chueh et al.

(10) Patent No.: US 8,775,999 B2
(45) Date of Patent: Jul. 8, 2014

(54) STANDARD CELL PLACEMENT METHOD TO EXERCISE PLACEMENT PERMUTATIONS OF STANDARD CELL LIBRARIES

(71) Applicant: Advanced Micro Devices Inc., Sunnyvale, CA (US)

(72) Inventors: Juang-Ying Chueh, Cupertino, CA (US); Charles Tung, Westford, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 13/672,565

(22) Filed: Nov. 8, 2012

(65) Prior Publication Data

US 2014/0130003 A1    May 8, 2014

(51) Int. Cl.
*G06F 17/50*    (2006.01)

(52) U.S. Cl.
USPC ............ 716/122; 716/118; 716/119; 716/139

(58) Field of Classification Search
USPC .................... 716/118–119, 122, 139
See application file for complete search history.

(56) References Cited

U.S. PATENT DOCUMENTS 7,036,103 B2 *   4/2006   Miller et al. .................. 716/122
7,331,026 B2 *   2/2008   Sampath ....................... 716/112

\* cited by examiner

*Primary Examiner* — Nghia Doan
(74) *Attorney, Agent, or Firm* — Staniford Tomita LLP

(57) ABSTRACT

A method for validating standard cells stored in a standard cell library and for use in design of an integrated circuit device is described. Each standard cell of the standard cells is iteratively placed adjacent to each side and corner of itself and each other standard cell of the standard cells to produce an interim test layout comprising a first plurality of cell pair permutations. The cell pair permutations are reduced by identifying at least one of: illegal or redundant left-right and top-bottom boundaries, and removing any cell pair permutations using the identified boundaries to generate a final test layout comprising a second plurality of cell pair permutations.

18 Claims, 13 Drawing Sheets

```
                ┌─────────────────────────────────────┐
         300    │ DEFINE DIFFERENT ORIENTATIONS OF EACH│
                │           STANDARD CELL              │
                │                302                   │
                └─────────────────┬───────────────────┘
                                  ▼
                ┌─────────────────────────────────────┐
                │ PLACE FIRST CELL NEXT TO ITSELF AND  │
                │ EACH OF THE OTHER N CELLS AND REDUCE │
                │                304                   │
                └─────────────────┬───────────────────┘
                                  │
                  ┌───────────────▼───────────────────┐
                  │ PLACE NEXT CELL, i, NEXT TO ITSELF│
                  │ AND EACH OF THE OTHER CELLS i+1 TO N│
                  │              306                  │
                  └───────────────┬───────────────────┘
                                  ▼
                  ┌───────────────────────────────────┐
                  │      PERFORM CASE REDUCTION       │
                  │              307                  │
                  └───────────────┬───────────────────┘
                                  ▼
              Y            ╱ MORE THAN ONE ╲
              ┌───────────<  CELL REMAINING? >
                           ╲     308     ╱
                                  │ N
                                  ▼
                  ┌───────────────────────────────────┐
                  │    PLACE LAST CELL NEXT TO ITSELF │
                  │              310                  │
                  └───────────────┬───────────────────┘
                                  ▼
                  ┌───────────────────────────────────┐
                  │      PERFORM CASE REDUCTION       │
                  │              311                  │
                  └───────────────┬───────────────────┘
                                  ▼
                  ┌───────────────────────────────────┐
                  │       FLAG PROBLEM CELLS AND      │
                  │ UPDATE LIBRARY WITH FIXED CELLS IF ANY │
                  │              312                  │
                  └───────────────────────────────────┘
```

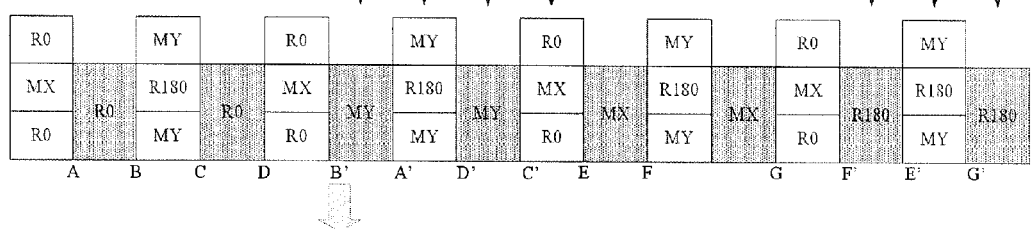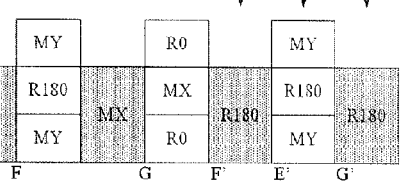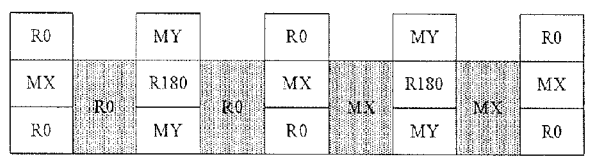
(a)
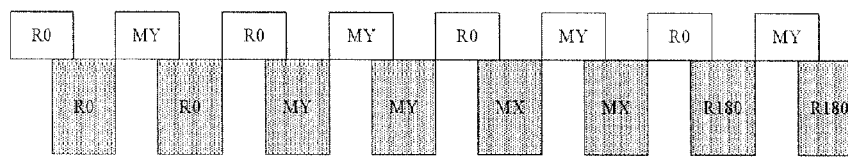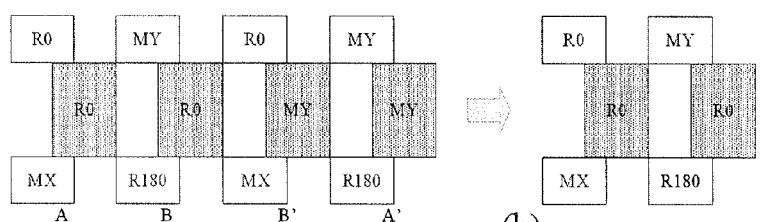
(b)
FIG. 13

1500

AAAA   AAAA  AAAAAAA  AAAA   AAAA

BBB   BBB  BBBBBB  BBB   BBB

AAAA   AAAA  AAAAAAA  AAAA   AAAA

BBB   BBB  BBBBBB  BBB   BBB c-1   c-2  c-3c-4   c-5   c-6

AAAAAAAAAAAA

BBBBBBBBBBBB can cover all 6 cases (c-1 to c-6)

111122223333 and 444455556666

AAAAAAAAAAAAAAAAAAAAAAAA

BBBBBBBBBBBBBBBBBBBBBBBB

AAAAAAAAAAAAAAAAAAAAAAAA   AAAAAAAAAAAAAAAAAAAAAAAA

888888222222444444666666        BBBBBBBBBBB (cases 10 and 12)

AAAAAAAAAAAAAAAAAAAAAAAA

BBBBBBBBBBBBBBBBBBBBBBBBBBBBBB can cover

AAAAAAAAAAAAAAAAAAAAAAAA 999999333333555555777777111111        and

AAAAAAAAAAAAAAAAAAAAAAAA

BBBBBBBBBBBB        (cases 11 and 13)

AAA   AAA AAA AAA   AAA
 BBB  BBBBBBBBB BBB

AAA  AAA  AAA

BBBBBBBBBBB can cover all cases, 111 222 333 and 444 555

AAAAAA   AAAAAA AAAAAAAAAAAAAAAAAAAAAAAA
     BBB      BBB    BBB   BBB    BBB    BBB
 and   AAAAAA  AAAAAA
    BBB     BBB

AAAAAA   and   AAAAAA   and   AAAAAA

888555<u>222</u>      777<u>444</u>111      <u>666</u>333

FIG. 15J

STANDARD CELL PLACEMENT METHOD TO EXERCISE PLACEMENT PERMUTATIONS OF STANDARD CELL LIBRARIES

TECHNICAL FIELD

One or more implementations relate generally to semiconductor design and manufacturing, and more specifically to verification of standard cells placed by automatic placement tools.

BACKGROUND

In an application-specific integrated chip (ASIC) design flow, standard cells are placed randomly by an automatic placement tool. It is essential for the standard cell designers to verify that the cells can be placed adjacent to any other standard cells in the library without causing design rule violations. Design rules are parameters provided by semiconductor manufacturers that enable the circuit designer to verify the correctness of a mask set. The basic design rules include a width rule that specifies the minimum width of any shape in the design and a spacing rule that specifies the minimum distance between any two adjacent objects, among others. Violations of the design rules usually occur at the cell boundaries because of insufficient distance of the layers such as metal, poly, or diffusion from the boundary. Such violations represent the so-called 'adjacent effect' of neighboring standard cells. One method to check for safe placement of standard cells consists of abutting each standard cell in the library with all other standard cells in every possible orientation. However, present implementations of this exhaustive method require significant amounts of time and resources in terms of processing overhead and disk space. Such current systems are also generally not compatible with double-height or multiple-height cells, and do not provide exhaustive coverage with respect to random placement of standard cells, or exhaustive coverage of randomly selected standard cells. Furthermore, if a design fault is discovered with respect to a standard cell during the design layout process, the original design itself must be changed, thus imposing significant costs to the design process.

FIG. 1 illustrates a process of designing an integrated circuit using standard cells under typical present methods. As shown in diagram 100, the physical design comprising a placement process 102 and routing process 104 of an integrated circuit (e.g., an ASIC) is made using standard cells provided by a standard cell library 108. Depending on the technology and/or the manufacturing processes of the IC, such a library may include any number of standard cells, such as between 200 to 400 or more standard cells. An original physical design undergoes the two major steps of placement and routing. The placement process 102 is performed by a computer-aided design (CAD) layout tool (placer) to place the standard cells in a layout. The layout is provided to another CAD layout tool (router) that performs a routing process 104 to route the wires that are used to connect the terminals of the placed standard cells. In general, standard cells are placed randomly by the placer, so a designer does not have total control over device placement. The layout from the router is checked against the design rules 106 to ensure that the design rule parameters are met. If the layout passes the design rule check (DRC) process, it passes to circuit tapeout process 110 and other production steps. If, however, the layout fails any of the design rules, the layout must be fixed. Failure of the design rules may be due to routing problems or placement problems. If the failure is related to routing, the routing process 104 is redone, which is often a relatively fast operation. If the failure is due to placement however, the placement process 102 will need to redone, which can be a much more significant task. If the failure is due to placement problems and is caused by the adjacent effect of the standard cells, the problem is usually pervasive in the entire layout. When a pervasive placement process occurs, the standard cells need to be redesigned and re-characterized. This requires the designer to repeat (in one or more iterations) the synthesis and physical design steps associated with the standard cell definitions, which can obviously add significant delay and expense to the overall design process.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY OF EMBODIMENTS

Some embodiments are directed to a method for deriving all permutations of a layout of standard cells in the design of an integrated circuit device, with the method comprising iteratively placing of the standard cells adjacent to each side and corner of itself and each of the other standard cells to produce an interim test layout comprising a first number of cell pair permutations, and reducing the first number of cell pair permutations by identifying illegal or redundant left-right and top-bottom boundaries and removing any cell pair permutations using the illegal or redundant boundaries to generate a final test layout comprising a second number of cell pair permutations.

Some embodiments are directed to a method for validating standard cells stored in a standard cell library and for use in the design of an integrated circuit device, with the method comprising identifying a target cell of the standard cell library and one or more test cells of the standard cell library, defining one or more orientations of the target cell with respect to an x axis and y axis of the standard cell, placing (for each orientation of the one or more orientations of the target cell) the target cell adjacent to itself and each of the one or more test cells to generate a plurality of cell pair permutations, reducing the number of placements by identifying illegal or redundant left-right and top-bottom boundaries and removing any cell pair permutations using the illegal or redundant boundaries to generate a final test layout for the target cell, and performing a design rule check on the final test cell layout to flag a possible problem associated with any cell pair permutation.

Some embodiments are directed to an apparatus or system comprising one or more processing elements that perform the acts or process steps of the two methods described above.

BRIEF DESCRIPTION OF THE DRAWINGS

In the following drawings like reference numbers are used to refer to like elements. Although the following figures depict various examples, the one or more implementations are not limited to the examples depicted in the figures.

FIG. 3 is a flowchart that illustrates a method of validating standard cells in a library using a standard cell check process, under some embodiments.

FIG. 13 illustrates a reduction of double-to-single height cells using boundary and horizontal alignment acts, under some embodiments.

FIG. 15A illustrates a horizontal alignment of cells, under some embodiments.

FIG. 15B illustrates different cases of multi-width cell alignment, under some embodiments.

FIG. 15C illustrates a reduction of different cases of multi-width cell alignment, under some embodiments.

FIG. 15D illustrates the processing of different width target and test cells, under some embodiments.

FIG. 15E illustrates different even cases of different width target and test cells, under some embodiments.

FIG. 15F illustrates different odd cases of different width target and test cells, under some embodiments.

FIG. 15G illustrates different cases of same-width cell alignment, under some embodiments.

FIG. 15H illustrates a reduction of different cases of same-width cell alignment, under some embodiments.

FIG. 15I illustrates different cases of integer multiple related width cell alignment, under some embodiments.

FIG. 15J illustrates a reduction of different cases of integer multiple related width cell alignment, under some embodiments.

DETAILED DESCRIPTION

Embodiments are generally directed to a method and system for validating standard cells in a standard cell library with respect to various different possible abutment orientations and adjacency configurations to ensure that any design utilizing the standard cells will not fail due to adjacent effects of the standard cells. A standard cell check process places the standard cells of the library in all possible standard cell pairing permutations to ensure full validation of standard cells with respect to any adjacent effect issues while standard cells are placed randomly by automatic placement tools. The standard cell check process maintains one-hundred percent coverage of all standard cell abutment configurations by placing all standard-cell physical views against each other in all possible combinations (permutations). A set of techniques is also provided in the standard cell check process to reduce the total number of permutations for verification by identifying and eliminating redundant standard cell placement cases. Such embodiments further provide an efficient standard cell placement method and tool that eliminates redundant placement cases and that reduces the verification run-time and memory requirements to perform verification of the design rules on the final circuit design.

Any of the embodiments described herein may be used alone or together with one another in any combination. The one or more implementations encompassed within this specification may also include embodiments that are only partially mentioned or alluded to or are not mentioned or alluded to at all in this brief summary or in the abstract. Although various embodiments may have been motivated by various deficiencies with the prior art, which may be discussed or alluded to in one or more places in the specification, the embodiments do not necessarily address any of these deficiencies. In other words, different embodiments may address different deficiencies that may be discussed in the specification. Some embodiments may only partially address some deficiencies or just one deficiency that may be discussed in the specification, and some embodiments may not address any of these deficiencies.

Embodiments are generally discussed with respect to the use of standard cells in the design of application-specific integrated circuits (ASICs), though embodiments are not so limited. A standard cell represents design abstraction that encapsulates a low-level, VLSI (very-large-scale integration) layout into an abstract logic representation (e.g., a NAND gate or other logic gate). Standard cell-based design allows one designer to focus on the logical or functional aspect of digital design, while another designer focuses on the implementation aspect of the design, and is critical in facilitating the efficient design of everything from simple single-function ICs to complex multi-million gate system-on-a-chip (SoC) devices.

Figure 1:
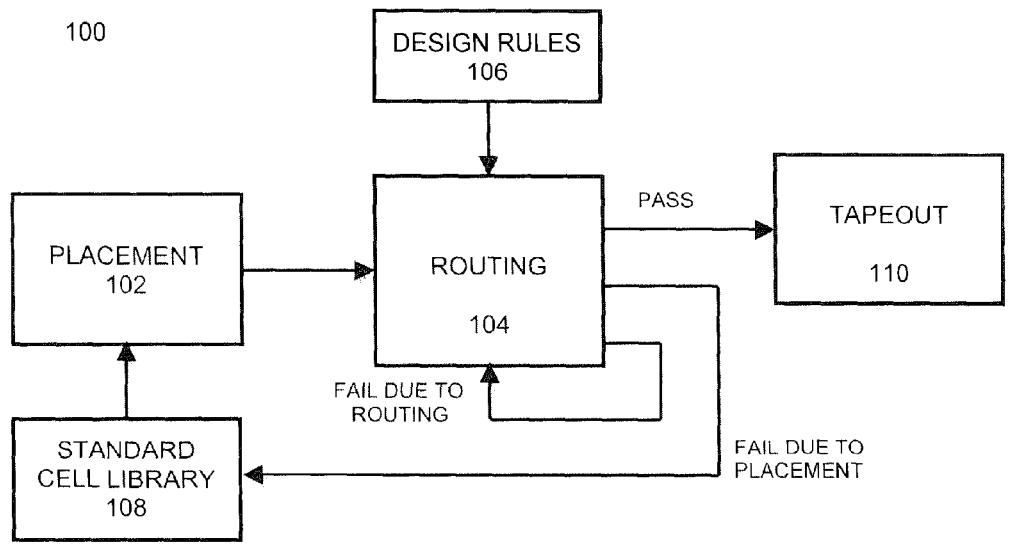
FIG. 1 illustrates a process of performing circuit design using standard cells under typical present methods.
Figure 2:
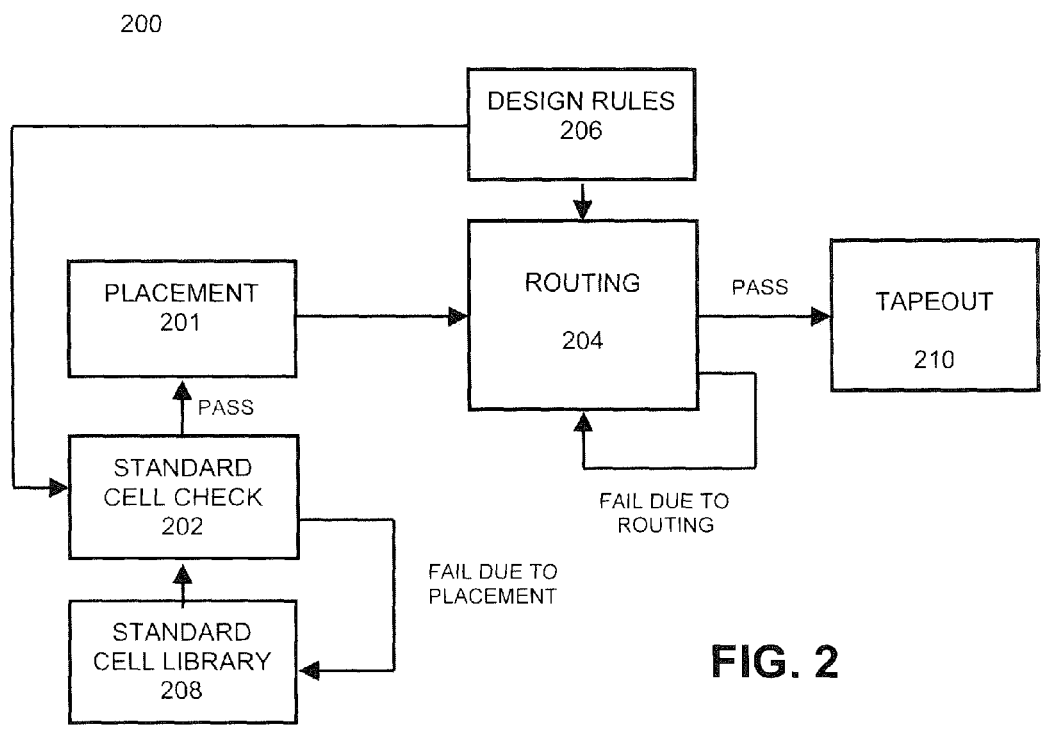
FIG. 2 illustrates a process of performing circuit design using a standard cell check process for verifying standard cells, under some embodiments.

FIG. 2 illustrates a process of performing circuit design using a standard cell check process for verifying standard cells under some embodiments. As shown in FIG. 2, the placement of standard cells (or simply 'cells') provided by a standard cell library 208 is provided to a placer that performs the placement process 201 and a router that performs the routing process 204 to generate a layout. As with existing processes, if the layout passes the design rule check 206, it proceeds to tapeout and production. If there is a failure due to routing, the layout is re-routed. As shown in process 200 and in contrast with existing methods, any failure due to placement, as opposed to routing, is caught prior to the routing process 204. Under some embodiments, the standard cells are first validated using a standard cell check process 202. This standard cell check process 202 checks all placement permutations of the standard cells in relation to one another and for each standard cell in the standard cell library 208 to make sure that no combination of cells violates any of the design rules or suffers from any adjacent effects or other placement effects not covered by the design rule check upon standalone individual cells. If any standard cell or combinations of standard cells causes any problem due to placement relative to other standard cells, the relevant cells can be corrected, modified, or redesigned. In this way, the standard cell library 208 can be updated to contain only standard cells that are validated by the standard cell check process 202. When these standard cells are then laid out through placement process 201 and passed to routing process 204, there should be no failure of the layout process due to adjacent effects or design rule violations by any of the standard cells, and any layout using validated standard cells without any routing violation should pass directly to the tapeout process 210. In contrast with the process illustrated in FIG. 1, any failure due to pervasive adjacent effects will not require a redesign of the circuit, but rather a change in the definition of one or more of the standard cells in a very early design stage while developing the standard cell library, which will almost always be a much easier and cheaper solution. In this manner, process 200 of FIG. 2 features the advantage of catching any placement problems due to pervasive adjacent effect issues of standard cell designs prior to the routing process, and eliminates the need to go through the synthesis and physical design steps associated with the standard cell definitions.

Figure 4:
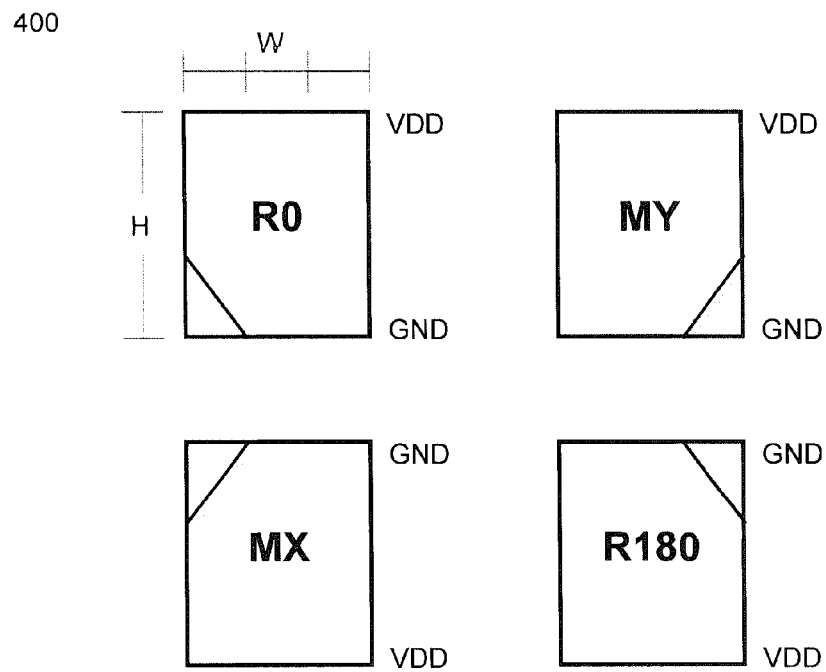
FIG. 4 illustrates four different orientations of a standard cell that can be used in a standard cell check process, under some embodiments.

In some embodiments, the standard cell check process 202 checks each cell of the standard cell library 208 against every other cell of the library including itself. Standard cells of different heights and widths are checked against each other in every possible combination of abutments or adjacent positions based on their relative sizes, including diagonal placement to check for corner effects. FIG. 3 is a flowchart that illustrates a method of validating standard cells in a library using a standard cell check process, under some embodiments. Standard cell check process 300 begins with defining each possible orientation of each standard cell. FIG. 4 illustrates four different orientations of a standard cell that can be used in the standard cell check process 202. As shown in diagram 400 of FIG. 4, a rectangular shaped standard cell is shown in a first orientation denoted 'R0' relative to VDD and GND with an index mark in the lower left corner. The standard cell is of a certain height, H, which is typically expressed as a standard unit, such as single-height, double-height (2 times single height), triple-height (3 times single height), and so on. The standard cell is also of a certain width, which is typically expressed as a unit of compact poly pitch (CPP). The example shown in FIG. 4 is a 3 CPP wide cell. In a typical case, standard cells in a library may range in height from single to triple height, and in width from 3 CPP to 30 CPP wide. For purposes of the following description, the minimum unit to shift a cell horizontally is referred to as a single CPP unit, however, any similar measure other than CPP may be used to denote this minimum shift unit.

Standard cells may be placed in various different orientations relative to their shape and the ground and power planes of the circuit. As shown in FIG. 4, the orientation denoted 'MY' is the standard cell flipped along the Y axis, so that the VDD and GND planes remain the same, but the index mark is now in the lower right corner. The orientation denoted 'MX' is the standard cell flipped along the X axis, so that the VDD and GND planes are reversed, and the index mark is in the upper left corner. The orientation denoted 'R180' is the standard cell rotated 180 degrees from the R0 orientation so that the VDD and GND planes are reversed and the index mark is in the upper right corner. As can be seen in diagram 400, these four orientations represent all possible orientations of the standard cell for placement between parallel VDD and GND planes.

Figure 5:
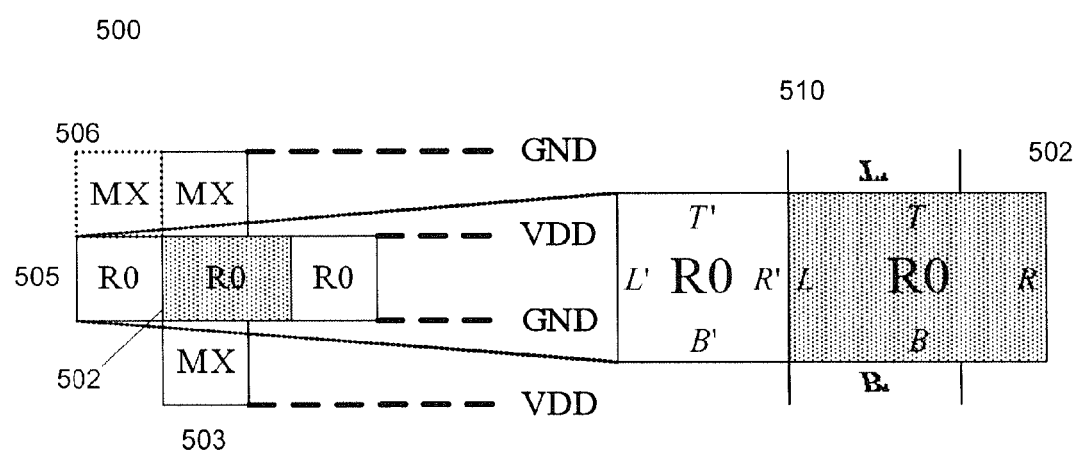
FIG. 5 illustrates the different abutting edges and corners of two single-height standard-cells placed in an example placement, under some embodiments.

Using the different orientations for each of the standard cells, such as shown in FIG. 5, the standard cell check process 300 iteratively checks each pair-wise combination of the standard cells. For N cells in the library, the process places a first cell of the library next to itself and each of the other N cells in the library, act 304. The second cell is then placed next to itself and all of the other cells minus the first cell (since this was already checked in act 304). The third cell is then placed next to itself and all of the other cells minus the first and second cells, and so on for all of the other cells. As shown in FIG. 3, this is expressed as placing each cell i next to itself and the other cells i+1 to N, act 306. The second-to-last cell is paired only with itself and the last cell, and the last cell is paired only with itself, so that in act 308, the process checks to see whether there is more than one cell remaining in the present iteration. If not, then the present cell is the last cell, which is checked only against itself, act 310. In general, for N number of standard cells, the standard cell check process 300 goes through N iterations with $\Sigma N-i$, (for i=0 to N−1) pair-wise comparisons for each of the orientations of the individual cells.

In some embodiments, the standard cell check process 300 may also include one or more case reduction acts 307 and 311 for the standard cell placement. In general, a case reduction operation is performed after each layout is generated, thus a reduction operation is illustrated as part of act 304 for the placement of the first cell, and for each of the following cells, act 307 and after the placement of the last cell, 311. The case reduction acts eliminate redundant combinations and reduces the verification run time, and also reduces the amount of space required for placement of the standard cells. The case reduction acts may perform the same steps as one another or they may perform different steps depending on the specific configurations of the different layouts.

The validations performed for each of the pair-wise checks will reveal any adjacency problems due to specific standard cells. These cells are flagged so that a designer may modify, delete, or otherwise fix the cells as necessary, act 312. The standard cell library can then be updated with the new standard cell definitions. In this manner, the standard cell check process 300 ensures that any pair of standard cells in the library placed in any position next to each other will pass the design rule checks.

In some embodiments, the standard cell check process may be implemented in one or more circuits or components within a processing system. Such a processing system may be configured to execute program instructions or software code that implements one or more of the acts illustrated in FIG. 3. Depending on the system implementation, the acts of cell check process may be performed by a single unitary component or circuit, or they may be performed by two or more different components or circuits. For example, in some embodiments, a standard cell definition component may manage the standard cell definitions and the placement of the standard cells in the initial, interim and final placement configurations, while a case reduction component may perform the different case reduction acts on the placement configurations. In some embodiments, specific functions within these two main acts may be further divided and performed separate subcomponents.

As described in relation to process standard cell check process 300, each standard cell is placed next to or adjacent itself and at least one or more other standard cells. Since the standard cells may be of different sizes in terms of height (i.e., single-height, double-height, etc.) and unit width in terms of compact poly pitch dimension, there are potentially many different ways that any two standard cells can be placed adjacent to one another. For purposes of the description, the terms 'adjacent' and 'abutting,' both mean the placement of two cells next to each other in any practical configuration for purposes of validation using standard cell check process 300. FIG. 5 illustrates the different abutting edges and corners condition of two single-height standard-cell placement in an example placement methodology. In the following discussion, the term "target cell" is used to refer to a standard cell under test and the term "test cell" is used to refer to a standard cell whose orientation is being tested against the target cell. As shown in diagram 500, a number of test cells 503-506 are placed around a target cell 502 in different orientations. The R0 orientation is the neutral orientation when the standard cell layout is drawn and the MX orientation is an orientation in which a cell mirrored along the X-axis (i.e., flipped upside down with respect to the R0 orientation). The target cell 502 is oriented with ground (GND) on the bottom and supply (VDD) on the top in R0 orientation. The test cell 503 is in an MX orientation. In the middle row placement in FIG. 5, two vertical abutting edges are created by two standard cells: the left (L) edges of target cell abutting the right (R') edge of test cell and R edges of target cell abutting the L' edge of test cell, as shown in the expanded portion 510 of diagram 500. With the top row and bottom row of an MX oriented test cell 503, additional horizontal abutting edges are created, top (T) edge of target cell abutting T' edge of test cell and bottom (B) edge of target cell abutting B' edges of the test cell. Because the design rule check (DRC) is also performed on the diagonal direction, a diagonally placed test cell 506 is placed on the top left corner of the target cell to exercise corner abutting conditions.

In addition to the R0 and MX orientations, a standard cell can be placed in MY and R180 orientations, where MY is a cell mirrored along Y-axis, i.e., flipped horizontally, and R180 is a cell rotated by 180 degrees, as shown in FIG. 4. In standard cell placement, standard cells are placed along predefined horizontal VDD and GND rails during floor planning. Therefore, R90 and R270 orientations (rotated by 90 and 270 degrees, respectively) are not allowed. Such orientations, however, can be accounted for in some embodiments.

Figure 6:
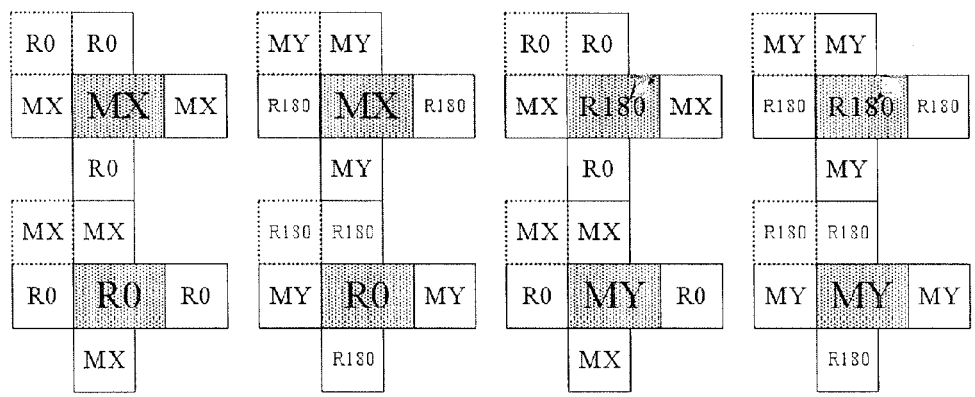
FIG. 6 illustrates the orientations of two single-height standard cells in a series of two rows, under some embodiments.

The addition of the MY and R180 orientations require additional test cell placements above those shown in FIG. 5. FIG. 6 illustrates the orientations of two single-height standard cells, under some embodiments using all four possible standard cell orientations: R0, MX, MY, R180. The layout 600 of FIG. 6 ensures target cells and test cells are rotated in all four different orientations and more "legal" abutting edges and corners are exercised. Some abutting cases are illegal and not exercised. For example, because the VDD and GND rails are always drawn on the top edges and bottom edges of a single-height standard cell, the case of an R0 cell on top of another R0 cell would create a short between VDD and GND, and is thus not exercised since it is illegal. Diagram 600 of FIG. 6 thus illustrates the permutations of a layout to cover the left-right boundaries and corner abutments of a target cell (denoted in gray colored blocks).

Figure 7:
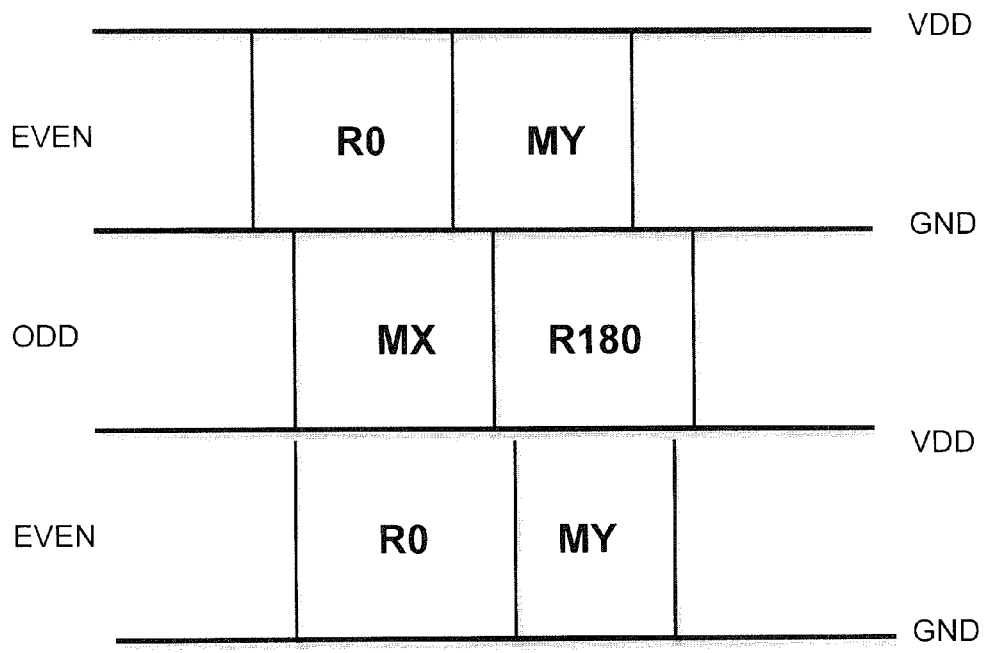
FIG. 7 illustrates a formation of target cells and test cells in rows, under some embodiments.

The placement of cells in multiple rows, such as that shown in FIG. 6 produces rows with respect to the VDD and GND planes. FIG. 7 illustrates a formation 700 of target cells and test cells in rows, under some embodiments. The cells placed in the R0 and MY orientation have the VDD plane running along the top and the GND plane running along the bottom, and this row of cells is denoted as an 'even' row. The cells placed in the MX and R180 orientation have the GND plane running along the top and the VDD plane running along the bottom, and this row of cells is denoted as an 'odd' row. Because of the strict requirement of VDD and GND plane separation, it is not possible to have an even row placed directly on top of another even row, or an odd row placed on top of another odd row.

For cells that are abutted on top of the others, every possible horizontal alignment needs to be taken into account by the test cell placement process. Thus, shifts in the horizontal positioning of two vertically placed cells are required if either or both of the cells is greater than one standard unit wide. As mentioned previously, for purposes of the present discussion, a compact poly pitch unit, CPP will be used to denote the minimum unit of horizontal shift. For example, consider an example in which cell A is 4 CPP wide and cell B is 3 CPP wide. In this case, there are six different ways in which cell A can be aligned on top of cell B, as shown in FIG. 15A. In diagram 1500 of FIG. 15A, cell A and cell B are overlapped by one CPP unit at a time, so that each portion of cell B is overlapped with every other portion of cell A through the six shifts of alignment. There is no vertical alignment (in the case of single-height cells) since standard cells are placed along the predefined VSS and GND rails during floor planning. In FIG. 15A, and generally in other figures, the AAAA component denotes a 4 CPP wide cell, <u>AAAA</u> denotes another neighboring 4 CPP wide cell (the underline distinguishes the two different cells), BBB denotes a 3 CPP wide cell, and <u>BBB</u> denotes another neighboring 3 CPP wide cell.

In addition to single-height cells, there are may be multiple-height cells in the standard-cell library, such as double height cells or triple height cells to meet some timing or routing resource requirement. Embodiments described herein are generally directed to placement using single height cells, but it should be noted that these techniques for single-height cells can be extended to multiple-height cells.

Case-Reduction Techniques

In general, the total number of combinations processed by the standard cell check process 202 grows exponentially with the total number of standard cells in the standard cell library 208. More combinations yield more physical area, which linearly impacts the DRC verification run time and the memory requirement of the computer executing the methodology. To manage the DRC verification run time efficiently, various case-reduction techniques can be implemented in some embodiments to eliminate redundant standard cell combinations and reduce the verification run time. This is illustrated as case reduction acts 307 and 311 in FIG. 3. The reduction efficiency of each reduction technique depends on total number of standard cells, number of multiple-height standard cells, and width variation of standard cells across the whole standard cell library. Therefore, the total reduction efficiency may vary when these techniques are applied to different standard cell libraries.

Figure 8:
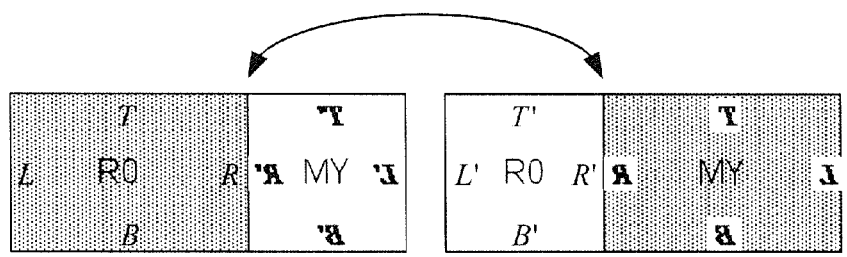
FIG. 8 illustrates the mirroring of a cell pair and the creation of a redundant boundary that can be eliminated in a case reduction process, under some embodiments.

In certain cases, a reduction can be obtained for the left-right boundary and corner abutment. In FIG. 6, the boundary created R0 target cell placed on the left of MY test cell is the mirrored Y-axis version of boundary created by R0 test cell on the left of MY target cell. This is illustrated in FIG. 8 in which the R0-MY cell pair 802 is shown as mirrored by R0-MY cell pair 804. As shown in diagram 800 of FIG. 8, the R-R' boundary is redundant between these two pairs, and can thus be eliminated. FIG. 8 thus illustrates a common boundary created by two different permutations of a test cell and target cell pair.

Figure 9:
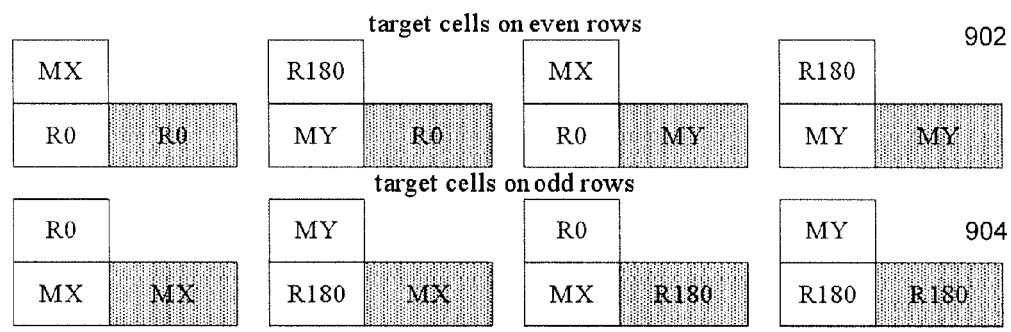
FIG. 9 illustrates the left-right boundary and corner abutment set for the reduction of the layout of FIG. 6, under some embodiments.
Figure 10:
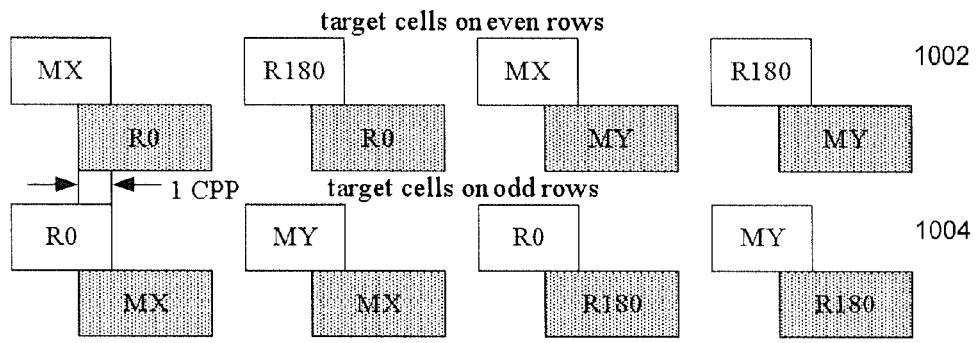
FIG. 10 illustrates the top-bottom boundary and horizontal alignment of the layout of FIG. 6, under some embodiments.

The number of combinations in the case of single-to-single height abutments can be reduced in a number of ways. For example, in FIG. 6, the bottom row 604 of instances can be removed because this same situation is tested in the top row of placement. That is, the abutment created by R0 target cell on top of MX test cell is equal to the abutment created by R0 test cell on top of MX target cell. The permutations can be further broken down into two sets as shown in FIGS. 9 and 10. FIG. 9 illustrates the left-right boundary and corner abutments for the reduction of layout 600 of FIG. 6. FIG. 9 illustrates two separate cases, diagram 902 illustrates a case where the target cells are on the even rows and the test cells are on the odd rows, and diagram 904 illustrates the case where the target cells are on the odd rows and the test cells are on the even rows. FIG. 10 illustrates the top-bottom boundary and horizontal alignment of layout 600 of FIG. 6. FIG. 10 illustrates only the pattern of test and target with one overlapping CPP. The pattern continues by shifting one CPP in each set, until the test cell is no longer overlapped with the target cell. FIG. 10 illustrates two separate cases, diagram 1002 illustrates a case where the target cells are on the even rows and the test cells are on the odd rows, and diagram 1004 illustrates the case where the target cells are on the odd rows and the test cells are on the even rows.

Figure 11:
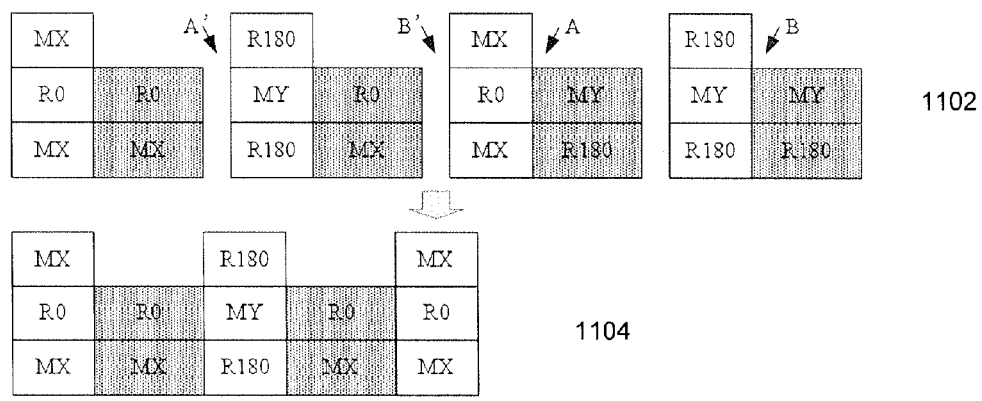
FIG. 11 illustrates a case reduction of the layout of FIG. 6 through elimination of common boundaries, under some embodiments.

Merging the odd row and even rows of layout 900 in FIG. 9 and eliminating the redundant boundaries as shown in FIG. 8, gives a permutation as shown in FIG. 11. The layout 1100 of FIG. 11 achieves an area reduction of 4×4(m+n)/3×(2m+3n) with a target cell of CPP-width m, and a test cell of CPP-width n. In layout 1100, the top-row test cells are placed to test the top-left corner of target cell in different orientations. FIG. 11 illustrates a reduction of layout 900 of FIG. 9 by the elimination of common boundaries A' and B' in layout 1102, since the A'/B' boundary is the mirrored Y-axis of the A/B boundary. The reduction yields the reduced layout 1104 shown in FIG. 11.

Figure 12:
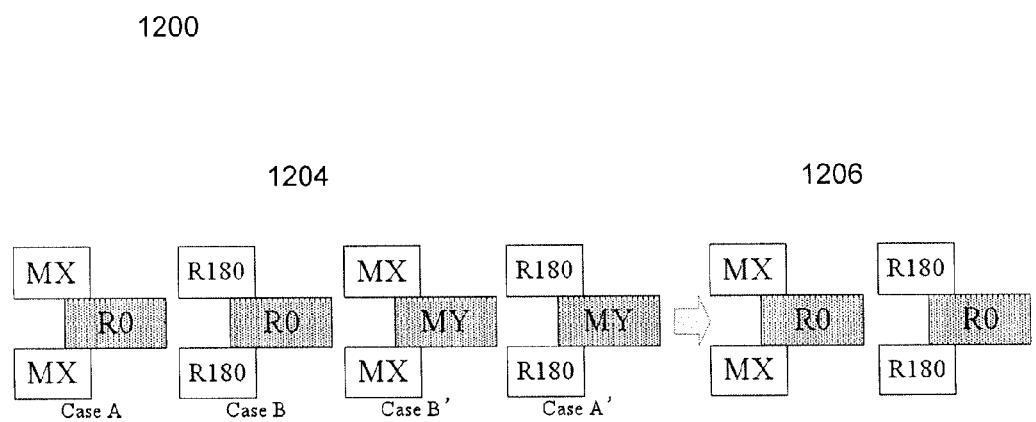
FIG. 12 illustrates a case reduction through certain top-bottom boundary and horizontal alignment acts, under some embodiments.

Further reduction can be achieved through certain top-bottom boundary and horizontal alignment. For example, by merging the odd row and even row and eliminating the common boundaries case A' and B' in the layout of FIG. 10. FIG. 12 illustrates an example of a reduction of layout 1000 of FIG. 10. In the example shown in diagram 1200, layout 1204 includes layouts labeled Case A, Case B, Case B', and Case A'. Eliminating the redundancies caused by Case A and Case A', and Case B and Case B' yields final layout 1206. As a final permutation, layout 1206 achieves a total reduction in area of 8/3 as compared to layout 1000 of FIG. 10.

In some embodiments, further case-reduction techniques can be applied based on the horizontal alignment of the test and target cells. In general, horizontal alignment of target and test cells depends on the relative width of the target and test cells. The target and test cells can be of the same size, but often they are of different widths. If the width of both types of cells is an integer expressed as a CPP width, three general cases arise: (1) the test and target cells are of different sizes, and one is not a multiple of the other, (2) the test and target cells are of equal width, and (3) the test and target cells are of different widths and one is a multiple of the other.

In the first horizontal alignment case, the target cell is of width m, and the test cell is of width n, and m and n are non-equal integers, wherein m is not an integer multiple of n, and vice versa. For example, the system processes a 4-CPP target cell and a 3-CPP test cell when m>n. In some embodiments of the cell placement process, the placement tool combines the cell pair in lateral with a 30-CPP width, as shown in the diagram FIG. 15B. In diagram 1510 of FIG. 15B, the first case (c-1) starts from the right most portion of the top target cell and overlaps the left most portion of bottom test cell with 1 CPP. For the subsequent cases (denoted c-2, c-3, c-4, c-5, and c-6), the bottom cell gradually shifts to the left until there is no overlap on the border between the top and bottom cells. The above cases can be replaced by the single following case with a total width of 12 CPP, as shown in diagram 1520 of FIG. 15C, in which the number 1111 or 2222 and so on denotes case number (c-1 to c-6) when the leftmost edge of the top cell row overlaps the rightmost edge of the lower one by one or more CPP unit (or equivalent horizontal unit). So in the first case, there is an overlap of 1 CPP unit, in the second case, there is an overlap of 2 CPP units, and so on for all six cases.

The same permutation shown above also applies to the case of a 3-CPP target cell and a 4-CPP test cell when m<n. The number of cases to cover all horizontal alignment is equal to equation (1) below:

$$m+n-1 \quad (1)$$

The original test case width required is m(m+n−1)+2(n−1+1)(n−1)/2, where the first term covers 'm-CPP width' multiplied by the 'number of cases in (1)' and second term covers the remaining CPP units of the test cell not overlapping with the target cell, like 2 CPP in c-1/c-6 and 1 CPP in c-2/c-5. The equation eventually becomes as shown in equation 2:

$$m^2+mn+n^2-m-n \quad (2)$$

In another example, consider an 8-CPP target cell and a 6-CPP test cell, as shown in diagram 1530 of FIG. 15D. This can cover the even number cases, i.e., cases 2, 4, 6, 8, 10 and 12, as shown in diagram 1540 of FIG. 15E. This requires one more set to cover odd number cases, as shown in diagram 1550 of FIG. 15F.

In diagram 1550, the second set is shifting B row in the first set by 1 CPP (case 9, 3, 5, 7) and n−1 additional CPP in the end (case 1). For the case of m=12 and n=9, the first set total width is lcm(m,n); the second set is shifting B row in the first set by 1 CPP and n−1 additional CPP in the end; and the third set is shifting B row by 2 CPP and n−2 additional CPP in the end. Therefore, the total test case width required is reduced to:

$$lcm(m,n)+(lcm(m,n)+1)+n-1+(lcm(m,n)+2)+n-2=lcm(m,n)+lcm(m,n)+lcm(m,n)+2n.$$

To generalize, the above equation then becomes:

$$lcm(m,n) \times gcd(m,n)+(gcd(m,n)-1) \times n.$$

Taking the case of m<n into account, the equation above can be generalized to that shown in equation (3) below:

$$lcm(m,n) \times gcd(m,n)+(gcd(m,n)-1) \times \min(m,n), \quad (3)$$

In equation 3, lcm(m,n) is the least common multiple of m and n, gcd(m,n) is the greatest common divisor of m and n and min(m,n) is the smaller number between m and n.

In the second horizontal alignment, the target cell and the test cell are of the same width m. For example, the system processes a 3-CPP target cell and a 3-CPP test cell, so m=3. In this example, the placement tool combines the cell pair in lateral with a 21-CPP width as shown in diagram 1560 of FIG. 15G. This can be replaced by following case with 12-CPP width shown in diagram 1570 of FIG. 15H.

By replacing n by m in equation (2) above, the original test case area is as shown in equation (4):

$$3m^2-2m=(3m-2)m \quad (4)$$

This can be reduced to equation (5):

$$m^2+m. \quad (5)$$

In this case, the area saving is (3m−2)/(m+1).

From equation (1), the total number of case is equal to 2m−1 when m=n. In equation (5), the first term m^2 can cover case 1 to case m−1 and case m+1 to case 2m−1. The second term m in equation (5) covers the case m where the top cell fully overlaps the bottom cell (as shown in case 3 in the above example).

In the third horizontal alignment, the target cell is of width m, and the test cell is of width n, and m and n are non-equal integers, wherein m is an integer multiple of n, or vice versa. For example, the system processes a 6-CPP target cell and a 3-CPP test cell when m>n. In this example, the placement tool combines the cell pair in lateral with 54-CPP width, as shown in diagram 1580 of FIG. 15I:

This placement can be replaced by case below with 24-CPP width, as shown in diagram 1590 of FIG. 15J.

In above three sets, the CPP width required for each set is equal to (m+n), (m+n), and m, respectively. The total width required is equal to 2(m+n)+m. To generalize, the equation becomes: (n−1)(m+n)+m=mn+n(n−1). Taking the case of m<n into account, the total test case width required is reduced as shown in equation (6):

$$mn+\min(m,n)\times(\min(m,n)-1). \qquad (6)$$

In some embodiments, reduction of processing steps can also be achieved by placing largest target cells first. That is, the largest cells in the library are selected to be the target cells, so that the standard cell check process 300 of FIG. 3 first operates on the largest cells and then on decreasing size cells. Because test cells are instantiated more often than target cells, starting with larger target cells generally reduces the overall areas to exercise all possible abutments.

The reduction techniques described above related to abutments of single-height cells to single-height cells. Such techniques can also be extended to test and target cells of different heights. A double-height to single-height permutation may result in a GND-VDD-GND configuration or a VDD-GND-VDD configuration. FIG. 13 illustrates a reduction of double-to-single height cells using boundary and horizontal alignment acts, under some embodiments. As shown in diagram 1300, a row of double height target cells are placed adjacent to a number of single height test cells in placement 1302. Redundant cases 1303, which includes specific cells marked by arrows, can be removed to produce interim placement layout 1304. The left-right boundary and corner abutment reduction techniques (denoted 'a') described above may be used to reduce the overall area by eliminating common boundaries that features an area reduction on the order of (8m+8n)/(4m+5n), which can be achieved for a target cell of width m CPP and a test cell of width n CPP. As shown in diagram 1306, a row of single height test cells are placed on top of double height target cells to exercise the top-bottom boundary conditions. By moving the test cells to the bottom of target cells as shown in placement layout 1308, the half of double height target cells can be eliminated while exercising the same top-bottom boundary conditions. Furthermore, by eliminating the redundant cases A' and B' in placement layout 1308, the final reduced placement layout 1310 is derived. Top-bottom boundary reduction techniques (denoted 'b') described above may be used to generate a final reduced placement layout 1310. With regard to the top-bottom boundaries, elimination of common boundaries can result in an area reduction on the order of three times.

Figure 14:
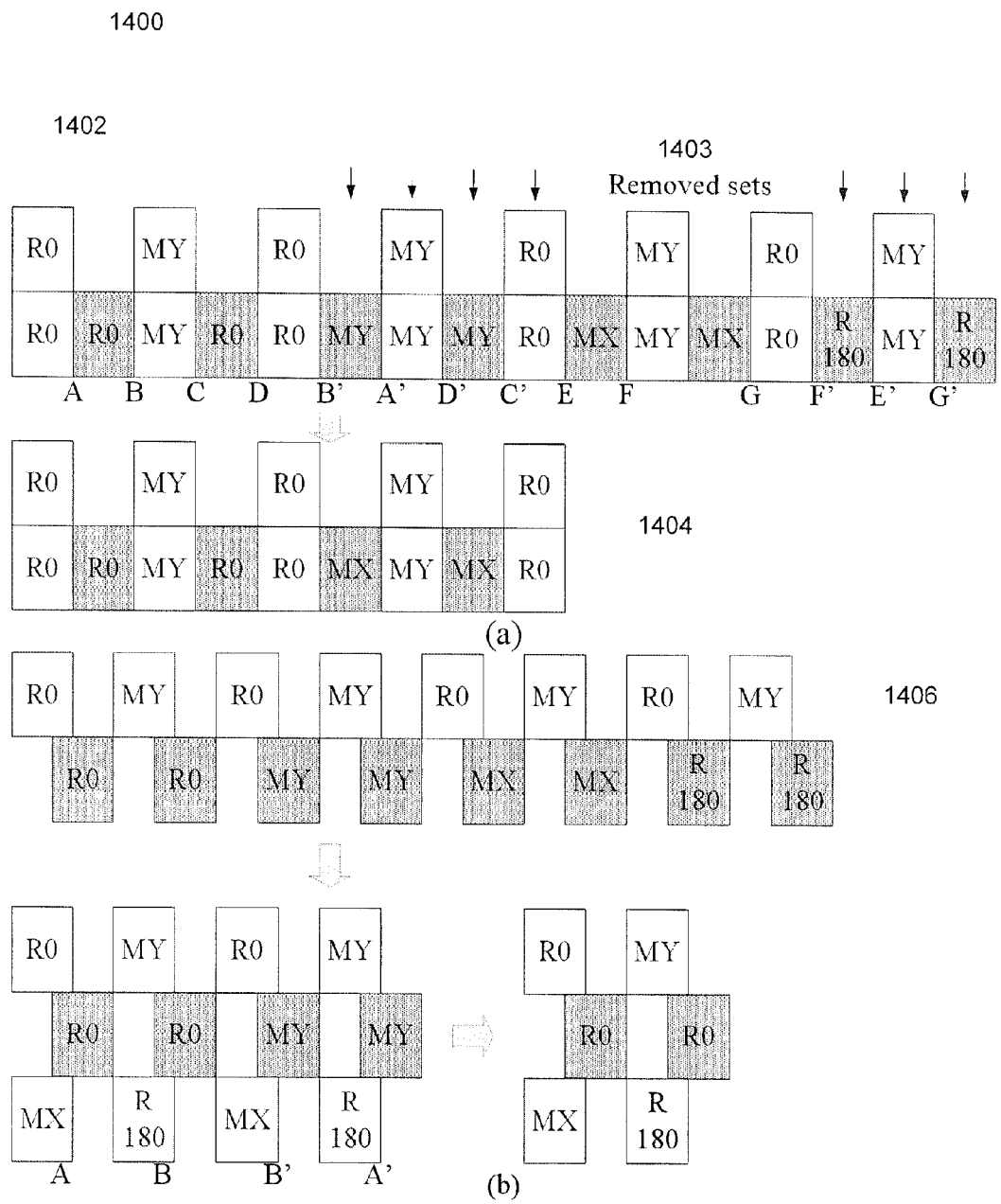
FIG. 14 illustrates a reduction of double-to-double height cells using boundary and horizontal alignment acts, under some embodiments.

Similar techniques and savings can be realized in the case of a double-height to double-height cell permutation. FIG. 14 illustrates a reduction of double-to-double height cells using boundary and horizontal alignment acts, under some embodiments. As shown in diagram 1400, a row of double height target cells are placed adjacent to a number of double height test cells in placement 1402. Redundant cases 1403, which includes specific cells marked by arrows, can be removed to produce interim placement layout 1404. The left-right boundary and corner abutment reduction techniques (denoted 'a') described above may be used to reduce the overall area by eliminating common boundaries, as shown in interim placement layouts 1404 that features an area reduction on the order of 8(m+n)/(4m+5n), which can be achieved for a target cell of width m CPP and a test cell of width n CPP. As shown in diagram 1406, a row of double height test cells are placed on top of double height target cells to exercise the top-bottom boundary conditions. By moving the test cells to the bottom of target cells as shown in placement layout 1408, the half of double height target cells can be eliminated while exercising the same top-bottom boundary conditions. Furthermore, by eliminating the redundant cases A' and B' in placement layout 1408, the final reduced placement layout 1410 is derived. Top-bottom boundary reduction techniques (denoted 'b') described above may be used to generate a final reduced placement layout 1410. With regard to the top-bottom boundaries, elimination of common boundaries can result in an area reduction on the order of 8/3.

In an example implementation of a sample standard cell library of single-height 455 standard cells with cell width range from 2 CPP to 33 CPP, in which all standard cells feature a 'symmetry x y' attribute (allowing for rotations of R0, MX, MY, R180), the standard cell check process can be performed on the placement permutations of all 455 standard cells in this sample library, according to the standard cell check process 300. In an example case, 455 runs can be exercised in the following order: the first widest cell (33 CPP) is paired with 455 cells; the second cell (32 CPP) is paired with 454 cells; and so on until, one of two 2-CPP cell is paired with last two 2-CPP cells; and the last 2-CPP cell is checked against itself. In an example case, the total normalized area to exercise all permutations of 455 cells are 1072590288 (before) and 134720319 (after) with an nearly eight-fold reduction in total area.

In general, the case reduction techniques are more efficient for wide cells and a large number of cells. In typical ASIC design, number of standard cells in one library can be in the range of several hundreds. The case-reduction described herein can help to reduce the layout verification DRC run time by about one order-of-magnitude in most implementations. An exhaustive placement tool is necessary in standard-cell development to place all standard-cell physical views against each other in all permutations to ensure 100% coverage of standard-cell placement topologies, and is compatible with multi-height cells, 100% permutation placement, and verifies every cell, adjacent boundary and corner abutment. The case-reduction techniques based on merging/eliminating the redundant cases provide significant savings in terms of processing overhead and disk space requirements.

For purposes of the present description, the terms "component," "module," "circuit," and "process," may be used interchangeably to refer to a processing unit that performs a particular function and that may be implemented through computer program code (software), digital or analog circuitry, computer firmware, or any combination thereof.

It should be noted that the various functions disclosed herein may be described using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, physical (non-transitory), non-volatile storage media in various forms, such as optical, magnetic or semiconductor storage media. Under some embodiments, the computer readable media may store program code or software instructions that are executed by a computer system and cause the computer system to perform at least some of the functions and processes of a method of performing validation of standard cells in a standard cell library, such as shown in standard cell check process 300 of FIG. 3.

The standard cell check process 300 may be executed as a computer-implemented process within a computer or other processor-based system that comprises a memory, a processor (e.g., microprocessor, application specific integrated circuit, programmable logic, or other similar circuitry) that executes program code or otherwise performs the acts of the process, along with other necessary supporting circuitry or hardware components. Such a system may be implemented as either a standalone processing component, or as a system of networked devices.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for deriving permutations of a layout of standard cells stored in a standard cell library and used in the design of an integrated circuit device, comprising:
   iteratively placing, using a processor-based system executing program instructions, each standard cell of the standard cells adjacent to each side and corner of itself and each other standard cell of the standard cells to produce an interim test layout comprising a first plurality of cell pair permutations;
   reducing the cell pair permutations by:
      identifying at least one of: illegal or redundant left-right and top-bottom boundaries as determined with respect to defined design rules, and
      removing any cell pair permutations using the identified boundaries to generate a final test layout comprising a second plurality of cell pair permutations;
   performing a design rule check on the final test cell layout to flag a possible problem associated with any cell pair permutation; and
   identifying the standard cells comprising any cell pair permutation for which the possible problem has been flagged.

2. The method of claim 1 further comprising:
   during each iteration of the iterative process, defining a first standard cell to be a target cell, and the remaining standard cells to be test cells;
   defining one or more orientations of the target cell with respect to an x axis and y axis of the first standard cell; and
   for each orientation of the one or more orientations of the target cell, placing the target cell adjacent to itself and each of the one or more test cells to generate a plurality of cell pair permutations.

3. The method of claim 2 wherein the target cell and each of the test cells comprises a multiple horizontal-unit width cell, and wherein the step of placing the target cell adjacent to itself and each of the one or more test cells comprises sliding one cell of each cell pair permutation along a side of the other cell of the cell pair permutation so that an abutment for each of the two cells of the cell pair permutation is performed for a plurality of possible adjacent placements of the two cells relative to one another.

4. A method for validating standard cells stored in a standard cell library and for use in the design of an integrated circuit device, comprising:
   identifying, in a processor-based system executing program instructions, a target cell of the standard cell library and one or more test cells of the standard cell library;
   defining one or more orientations of the target cell with respect to an x axis and y axis of the standard cell;
   for each orientation of the one or more orientations of the target cell, placing the target cell adjacent to itself and each of the one or more test cells to generate a plurality of cell pair permutations;
   reducing the number of placements by:
      identifying at least one of: illegal or redundant left-right and top-bottom boundaries as determined with respect to defined design rules, and
      removing any cell pair permutations using the illegal or redundant boundaries to generate a final test layout; and
   performing a design rule check on the final test cell layout to flag a possible problem associated with any cell pair permutation.

5. The method of claim 4 further comprising:
   identifying the standard cells comprising any cell pair permutation for which the possible problem has been flagged; and
   generating a notification to indicate a necessary change in the design of one or more of the standard cells in the cell pair permutation to eliminate the possible problem.

6. The method of claim 5 further comprising iteratively testing all cell pair permutations of the standard cell library by defining the target cell to be a next successive standard cell in the standard cell library in an iterative testing process.

7. The method of claim 6 wherein at least two of the standard cells in the standard cell library are of different sizes, and wherein a larger standard cell of the at least two standard cells is selected to be the target cell in a first iteration of the iterative testing process.

8. The method of claim 7 wherein the size of a standard cell is defined by a minimum horizontal width expressed in terms of compact poly pitch (CPP) dimension, and a height expressed as a single, double, or triple height unit.

9. The method of claim 8 wherein the standard cells stored in the standard cell library are each shaped in a rectangle and symmetric with respect to the x-axis and y-axis, and wherein the one or more orientations of the target cell comprise a standard orientation, a flipped x-axis orientation, a flipped y-axis orientation, and a rotated 180 degree orientation.

10. The method of claim 9 wherein the step of placing the target cell adjacent to itself and each of the one or more test cells comprises placing each orientation of the target cell and test cells next to each other along each side of their respective rectangle shape so that each cell pair permutation is represented as two cells abutted next to each other.

11. The method of claim 10 further comprising placing the target cell adjacent to itself and each of the one or more test cells on a respective corner of each cell.

12. The method of claim 11 wherein the target cell and each of the test cells comprises a multiple CPP width cell, and wherein the step of placing the target cell adjacent to itself and each of the one or more test cells comprises sliding one cell of each cell pair permutation along a side of the other cell of the cell pair permutation so that an abutment for each of the two cells of the cell pair permutation is performed for a plurality of possible adjacent placements of the two cells relative to one another.

13. The method of claim 11 wherein the design rule check comprises an adjacency check that identifies a presence or absence of electrical interference between each cell of each cell pair permutation.

14. The method of claim 12 wherein reducing the number of placements by identifying illegal or redundant left-right and top-bottom boundaries comprises identifying improper placement of ground and power planes in each cell pair permutation.

15. The method of claim 12 wherein reducing the number of placements by identifying illegal or redundant left-right and top-bottom boundaries comprises identifying repeated boundaries formed within a row comprising cells of different orientations placed adjacent to one another, wherein the repeated boundaries match other boundaries of the row through identical left-right boundary conditions produced by one or more different orientations of the adjacent cells.

16. The method of claim 12 wherein reducing the number of placements by identifying illegal or redundant left-right and top-bottom boundaries comprises identifying repeated boundaries formed within a column comprising cells of different orientations placed adjacent to one another, wherein the repeated boundaries match other boundaries of the column through identical top-bottom boundary conditions produced by one or more different orientations of the adjacent cells.

17. An apparatus for deriving all permutations of a layout of standard cells stored in a standard cell library for use in the design of an integrated circuit device, comprising:
a first component to iteratively place each standard cell of the standard cells adjacent to each side and corner of itself and each other standard cell of the standard cells to produce an interim test layout comprising cell pair permutations;
a second component to reduce the cell pair permutations by identifying at least one of: illegal or redundant left-right and top-bottom boundaries with respect to defined design rules, and removing any cell pair permutations using the illegal or redundant boundaries to generate a final test layout; and
a third component to perform a design rule check on the final test cell layout to flag a possible problem associated with any cell pair permutation, and identify the standard cells comprising any cell pair permutation for which the possible problem has been flagged.

18. A non-transitory computer-readable medium containing programming instructions which, when executed by a processor-based system, cause the system to derive permutations of a layout of standard cells stored in a standard cell library for use in the design of an integrated circuit device, the instructions further causing the processor-based system to:
iteratively place each standard cell of the standard cells adjacent to each side and corner of itself and each other standard cell of the standard cells to produce an interim test layout comprising a first plurality of cell pair permutations;
reduce the cell pair permutations by:
identifying at least one of: illegal or redundant left-right and top-bottom boundaries as determined with respect to defined design rules, and
removing any cell pair permutations using the identified boundaries to generate a final test layout comprising a second plurality of cell pair permutations;
performing a design rule check on the final test cell layout to flag a possible problem associated with any cell pair permutation; and
identifying the standard cells comprising any cell pair permutation for which the possible problem has been flagged.

\* \* \* \* \*